(12) United States Patent
Cho

(10) Patent No.: US 10,672,798 B2
(45) Date of Patent: Jun. 2, 2020

(54) ACTIVE ARRAY SUBSTRATE AND METHOD OF MANUFACTURING THE SAME

(71) Applicants: HKC Corporation Limited, Shenzhen, Guangdong (CN); Chongqing HKC Optoelectronics Technology Co., Ltd., Chongqing (CN)

(72) Inventor: En-Tsung Cho, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/462,000

(22) PCT Filed: Oct. 16, 2017

(86) PCT No.: PCT/CN2017/106320
§ 371 (c)(1),
(2) Date: May 17, 2019

(87) PCT Pub. No.: WO2018/120997
PCT Pub. Date: Jul. 5, 2018

(65) Prior Publication Data
US 2019/0326333 A1    Oct. 24, 2019

(30) Foreign Application Priority Data
Dec. 30, 2016  (CN) .......................... 2016 1 1270692

(51) Int. Cl.
*H01L 21/00*       (2006.01)
*H01L 27/00*       (2006.01)
(Continued)

(52) U.S. Cl.
CPC ........ *H01L 27/1237* (2013.01); *H01L 27/124* (2013.01); *H01L 27/127* (2013.01);
(Continued)

(58) Field of Classification Search
CPC ............... H01L 27/1237; H01L 27/124; H01L 27/1262; H01L 27/127; H01L 27/11524;
(Continued)

(56) References Cited

U.S. PATENT DOCUMENTS

| 7,309,650 B1 | 12/2007 | Wang et al. | |
| 7,719,010 B2* | 5/2010 | Bae | H01L 27/124 257/59 |
| 2008/0191213 A1* | 8/2008 | Bae | H01L 29/458 257/66 |

FOREIGN PATENT DOCUMENTS

| CN | 1787757 A | 6/2006 |
| CN | 102645799 A | 8/2012 |

(Continued)

OTHER PUBLICATIONS

Granitzer et al., "Porous Silicon—A Versatile Host Material", 2010, Materials, vol. 3, pp. 943-998, published Feb. 3, 2010.*
(Continued)

*Primary Examiner* — Nikolay K Yushin
(74) *Attorney, Agent, or Firm* — Muncy, Geissler, Olds & Lowe, P.C.

(57) ABSTRACT

A method of manufacturing an active array substrate, comprising: providing a substrate; forming gate electrodes on the substrate; forming a gate insulating layer, a semiconductor layer and an Ohmic contact layer on the transparent substrate and the gate electrodes in order; forming source electrodes and drain electrodes on the Ohmic contact layer; forming a protection layer on the source electrodes and the drain electrodes; and forming a pixel electrode layer on the
(Continued)

protection layer, wherein the pixel electrode layer is electrically connected to the drain electrode. The gate insulating layer comprises nanometer porous silicon and nanometer particles, and a dielectric constant of the nanometer particle is greater than a dielectric constant of the nanometer porous silicon.

11 Claims, 3 Drawing Sheets

(51) Int. Cl.
  *H01L 29/00* (2006.01)
  *H01L 27/12* (2006.01)
  *H01L 29/423* (2006.01)
  *H01L 21/77* (2017.01)

(52) U.S. Cl.
  CPC .... *H01L 27/1262* (2013.01); *H01L 29/42384* (2013.01); *H01L 2021/775* (2013.01)

(58) Field of Classification Search
  CPC ........... H01L 27/11565; H01L 27/1285; H01L 27/1292; H01L 29/42384; H01L 29/12; H01L 29/40117; H01L 29/42324; H01L 29/06; H01L 29/0665; H01L 29/0847; H01L 21/76843; H01L 21/76885; H01L 21/28008; H01L 21/0228; H01L 21/02227; H01L 21/02636; H01L 21/31111

See application file for complete search history.

(56) References Cited

FOREIGN PATENT DOCUMENTS

| | | |
|---|---|---|
| CN | 102646634 A | 8/2012 |
| CN | 103030833 A | 4/2013 |
| CN | 105632896 A | 6/2016 |
| CN | 106057828 A | 10/2016 |
| CN | 106653688 A | 5/2017 |
| JP | 2000-323011 A | 11/2000 |
| JP | 2011-119375 A | 6/2011 |

OTHER PUBLICATIONS

Lehmann et al., "A novel capacitor technology based on porous silicon", 1996, Thin Solid Films, vol. 276, pp. 138-142, Dec. 1996.*

* cited by examiner

ACTIVE ARRAY SUBSTRATE AND METHOD OF MANUFACTURING THE SAME

BACKGROUND

Technical Field

This disclosure relates to a method of manufacturing an active array substrate, and more particularly to an active array substrate of a display panel and a method of manufacturing the same.

Related Art

A thin film transistor-liquid crystal display (TFT-LCD) has the low power consumption, excellent frame quality and high production yield and other performances, and has now gradually occupied the dominant position in the display field. Similarly, the TFT-LCD includes the display panel and the backlight module. The display panel includes a color filter substrate (CF substrate, also referred to as a color filter substrate) and a thin film transistor substrate (TFT substrate), and the transparent electrode is present on the opposite inner sides of the above-mentioned substrates. A layer of liquid crystal (LC) molecules is disposed between the two substrates. The display panel can control the directions of the liquid crystal molecules for changing the polarization of the light, and the polarizers can allow the polarized light to pass through or block the polarized light so as to carry out the display purpose.

Due to the continuous reduction in the sizes of the integrated circuits, chips and TFT-LCDs and the continuous increase of the package density of the device, the requirements on various aspects of the performances of the materials are continuously increased. Because the device is scaled down, the gate oxide insulating layer of the device becomes very thin, and the gate oxide insulating layer is getting thinner and thinner for the small-size device, and the new high-K gate oxide insulating dielectric material is needed.

SUMMARY

The technical problem to be solved by this disclosure is to provide a method of manufacturing an active array substrate having a gate insulating layer with the high dielectric constant.

The present disclosure provides a method of manufacturing an active array substrate, comprising: providing a substrate; forming gate electrodes on the substrate; forming a gate insulating layer, a semiconductor layer and an Ohmic contact layer on the transparent substrate and the gate electrodes in order; forming source electrodes and drain electrodes on the Ohmic contact layer; forming a protection layer on the source electrodes and the drain electrodes; and forming a pixel electrode layer on the protection layer, wherein the pixel electrode layer is electrically connected to the drain electrode. The gate insulating layer comprises nanometer porous silicon and nanometer particles, and a dielectric constant of the nanometer particle is greater than a dielectric constant of the nanometer porous silicon.

In some embodiments, the gate insulating layer comprises a first insulating layer and a second insulating layer stacked together, and the nanometer porous silicon and the nanometer particles are formed in the second insulating layer.

In some embodiments, the nanometer particles comprise two or more than two types of nanometer particles with different dielectric constants.

The nanometer porous silicon can be made very thin, can reduce the thickness of the insulating dielectric layer, and can satisfy the requirement that the sizes of the integrated circuit, the wafer, and the TFT-LCD are continuously reduced. The nanometer porous silicon itself is hydrophobic.

The dielectric constant of germanium is 16, and the dielectric constant of the gate insulating layer is increased by adjusting the ratio of germanium. Of course, other metals with high dielectric constants and other materials may also be used.

The nanometer porous silicon can be made very thin, can reduce the thickness of the insulating dielectric layer, and can satisfy the requirement that the sizes of the integrated circuit, the wafer, and the TFT-LCD are continuously reduced. The nanometer porous silicon itself is hydrophobic. The dielectric constant of the germanium is 16. The nanometer porous silicon itself has many silicon pores, and the germanium nanometer particles can be deposited into the silicon pores without increasing the thickness of the nanometer porous silicon. Adjusting the loading of the germanium (Ge) nanometer particles makes the dielectric constant be controllable and adjustable.

In this embodiment, the gate insulating layer includes nanometer porous silicon, the nanometer porous silicon comprises multiple hollow columnar sub-elements connected together, the sub-element has a hexagonal section, a circular through hole is formed at a middle of the sub-element, the circular through hole of the sub-element is provided with multiple silicon pores, and the nanometer particles are disposed in the silicon pores.

A sub-component of the porous silicon has a hexagonal section to facilitate the stitched arrangement of the multiple sub-components, the multiple germanium nanometer particles are disposed in the silicon pores, and the thickness of the porous silicon is not affected.

In one embodiment, the amorphous silicon layer corresponding to the gate conductor segment is disposed on the gate insulating layer. The Ohmic contact layer corresponding to the amorphous silicon layer is disposed on the amorphous silicon layer. The source electrodes and the drain electrodes separated from each other are disposed on the Ohmic contact layer. The trench is formed between the source electrodes and the drain electrodes. The trench penetrates through the Ohmic contact layer. The bottom portion of the trench is the amorphous silicon layer. The widths of the source electrodes and the drain electrodes are greater than the width of the amorphous silicon layer. The protection layer is disposed on the source electrodes and the drain electrodes. The pixel electrode layer is disposed on the protection layer. The protection layer is formed with a through hole corresponding to the drain electrode, and the pixel electrode layer is connected to the drain electrode through the through hole.

In one embodiment, the amorphous silicon layer corresponding to the gate conductor segment is disposed on the gate insulating layer. The Ohmic contact layer corresponding to the amorphous silicon layer is disposed on the amorphous silicon layer. The source electrodes and the drain electrodes separated from each other are disposed on the Ohmic contact layer. The trench is formed between the source electrodes and the drain electrodes. The trench penetrates through the Ohmic contact layer. The bottom portion of the trench is the amorphous silicon layer. The widths of the source electrodes and the drain electrodes are equal to the width of the Ohmic contact layer in contact therewith. The protection layer is disposed on the source electrodes and the drain electrodes. The pixel electrode layer is disposed on the protection layer. The protection layer is formed with a through hole corresponding to the drain electrode, and the pixel electrode layer is connected to the drain electrode through the through hole.

In one embodiment, a relative dielectric constant of the protection layer is smaller than relative dielectric constants of silicon oxide and silicon nitride.

The use of the protection layer having the low dielectric constant can enhance the device performance of the thin film transistor (TFT), and improve the signal crosstalk problem and the RC circuit delay problem.

In one embodiment, the protection layer having the low dielectric constant includes mesopore silicon oxide.

A relative dielectric constant $\varepsilon r$ of the mesopore silicon oxide ranges from 1.4 to 2.4, the protection layer having the low dielectric constant uses the mesopore silicon oxide to replace the protection layer material SiNx (the relative dielectric constant $\varepsilon r$=7 to 8) in the 5-mask and 4-mask process TFT device, $\varepsilon r$ of the mesopore silicon oxide is lower than $\varepsilon r$ of the general silicon oxide (the relative dielectric constant $\varepsilon r$=3.9 to 4.1), the TFT device performance can be enhanced, the signal crosstalk problem and the RC circuit delay problem can be improved, and the thickness of the protection layer having the low dielectric constant is reduced. Of course, the protection layer having the low dielectric constant can also use other materials having low dielectric constants, such as the nanometer porous silicon and the like.

In one embodiment, the mesopore silicon oxide includes multiple sub-units, the sub-unit includes sub-components arranged in three rows, the middle row of the sub-unit includes three sub-components disposed side by side, the first row and the third row of sub-units include two sub-components disposed side by side, the two sub-components of the first row and the third row are respectively disposed between arbitrary two sub-components of the middle one row of three sub-components, the sub-component has a hexagonal section, and the circular through hole is formed at a middle of the sub-component.

The sub-unit has the sub-components arranged in a regular order, and has a higher specific surface area, the better thermal stability and the hydrothermal stability. The sizes of the through holes of sub-components are uniform, the sub-component has a hexagonal section to facilitate the stitched arrangement of the multiple sub-components.

The dielectric constant of the gate insulating layer disposed on first layer of wires is greater than the dielectric constants of the silicon oxide layer and the silicon nitride layer, and the device storage charge capacity is increased. The gate insulating layer includes the combination, and the combination includes the first composition and the second composition. A dielectric constant of the first composition is smaller than the dielectric constants of the silicon oxide layer and the silicon nitride layer, and a dielectric constant of the second composition is greater than the dielectric constants of the silicon oxide layer and the silicon nitride layer. Adjusting the ratio of the first composition to the second composition makes the dielectric constant of the gate insulating layer be adjustable.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

Figure 1:
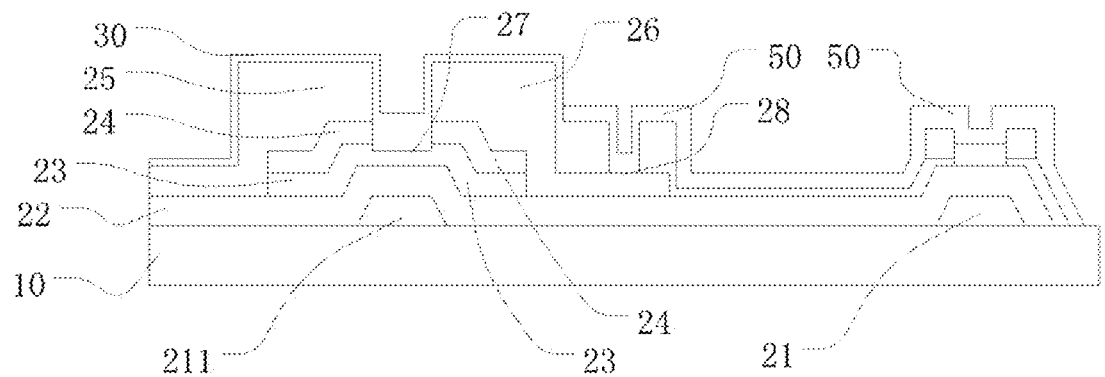
FIG. 1 is a schematic view showing an active array substrate according to an embodiment of this disclosure.

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, it is to be understood that the terms "center", "transversal", "up," "down," "left," "right," "vertical", "horizontal", "top," "bottom," "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. In addition, the terms "first," and "second" are used for the illustrative purpose only and cannot be understood as indicating or implying the relative importance or implicitly specifying the number of indicated technical features. Therefore, the features restricted by "first" and "second" may expressly or implicitly comprise one or multiple ones of the features. In the description of this disclosure, unless otherwise described, the meaning of "multiple" comprises two or more than two. In addition, the terms "comprises" and any modification thereof intend to cover the non-exclusive inclusions.

In the description of this disclosure, it needs to be described that, unless otherwise expressly stated and limited, the terms "mount," "link" and "connect" should be broadly understood. For example, they may be the fixed connection, may be the detachable connection or may be the integral connection; may be the mechanical connection or may also be the electrical connection; or may be the direct connection, may be the indirect connection through a middle medium or may be the inner communication between two elements. It will be apparent to those skilled in the art that the specific meanings of the above terms in this application may be understood according to the specific conditions.

The terms used herein are for the purpose of describing only specific embodiments and are not intended to limit the exemplary embodiments. Unless the contexts clearly indicate otherwise, the singular form "one," "a" and "an" used here further intend to include plural forms. It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

This disclosure is further described below with reference to the accompanying drawings and examples.

A display panel according to an embodiment of this disclosure will be described with reference to FIGS. 1 to 7.

Referring to FIG. 1, the display panel in FIG. 1 includes a substrate 10, a first layer of wires 21 disposed on the substrate 10, and a gate insulating layer 22 disposed on the first layer of wires 21. The gate insulating layer 22 is made of silicon nitride or silicon oxide. An amorphous silicon layer 23 corresponding to a gate conductor segment 211 of the first layer of wires 21 is disposed on the gate insulating layer 22. An Ohmic contact layer 24 corresponding to the amorphous silicon layer 23 is disposed on the amorphous silicon layer 23. A source electrode 25 and a drain electrode 26 separated from each other are disposed on the Ohmic contact layer 24. A trench 27 is formed between the source electrode 25 and the drain electrode 26. The trench 27 penetrates through the Ohmic contact layer 24. A bottom portion of the trench 27 is the amorphous silicon layer 23. Widths of the source electrode 25 and the drain electrode 26 are greater than a width of the amorphous silicon layer 23. A protection layer 30 is disposed on the source electrode 25 and the drain electrode 26. A pixel electrode layer 50 is disposed on the protection layer 30. The protection layer 30 is formed with a through hole 28 corresponding to the drain electrode 26, and the pixel electrode layer 50 is connected to the drain electrode 26 through the through hole 28. One partial side of the source electrode 25 exceeding the amorphous silicon layer 23 is directly connected to the gate insulating layer 22, and the other side of the source electrode 25 is directly connected to the protection layer 30. The portion of the gate insulating layer 22 corresponding to the through hole 28 is connected to the drain electrode 26. The thin film transistor (TFT) formed using five masks has the better performance.

Figure 2:
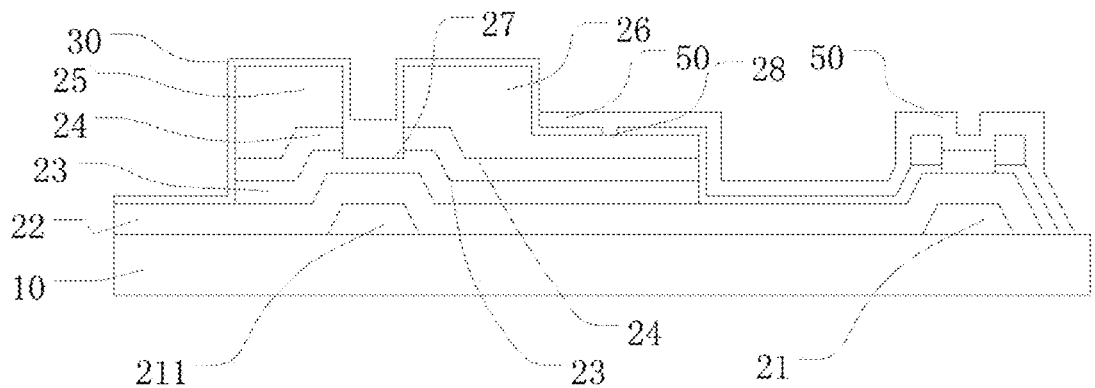
FIG. 2 is a schematic view showing the active array substrate according to the embodiment of this disclosure.

As shown in FIG. 2, the display panel in FIG. 2 includes a substrate 10, a first layer of wires 21 disposed on the substrate 10, and a gate insulating layer 22 disposed on the first layer of wires 21. The gate insulating layer 22 is made of silicon nitride or silicon oxide. An amorphous silicon layer 23 corresponding to a gate conductor segment 211 of the first layer of wires 21 is disposed on the gate insulating layer 22. An Ohmic contact layer 24 corresponding to the amorphous silicon layer 23 is disposed on the amorphous silicon layer 23. A source electrode 25 and a drain electrode 26 separated from each other are disposed on the Ohmic contact layer 24. A trench 27 is formed between the source electrode 25 and the drain electrode 26. The trench 27 penetrates through the Ohmic contact layer 24. A bottom portion of the trench 27 is the amorphous silicon layer 23. Widths of the source electrode 25 and the drain electrode 26 are greater than a width of the amorphous silicon layer 23. A protection layer 30 is disposed on the source electrode 25 and the drain electrode 26. A pixel electrode layer 50 is disposed on the protection layer 30. The protection layer 30 is formed with a through hole 28 corresponding to the drain electrode 26, and the pixel electrode layer 50 is connected to the drain electrode 26 through the through hole 28. The protection layer 30 on the outer side of the source electrode 25 is directly connected to the gate insulating layer 22, and the amorphous silicon layer 23, the Ohmic contact layer 24 and the drain electrode 26 are disposed above the gate insulating layer 22 corresponding to the through hole 28 in order. The thin film transistor (TFT) formed using four masks has the better performance, and the mask processes may be further saved.

Typically, a high-K dielectric constant material is chosen as the gate oxide dielectric layer material of the film crystal. As the progress of manufacturing processes and designs, due to the continuous reduction in the sizes of the integrated circuits, chips and TFT-LCDs and the continuous increase of the package density of the device, the requirements on various aspects of the performances of the materials are continuously increased. Because the device is scaled down, the gate oxide insulating layer of the device becomes very thin, and the gate oxide insulating layer is getting thinner and thinner for the small-size device, and the new high-K gate oxide insulating dielectric material is needed. The four-process or five-process TFT-Array array used in the above-mentioned embodiment has a very high voltage between the gate oxide dielectric and the previous stage of insulation protective layer in the TFT transistor. The gate oxide layer is affected by the tunneling current. When the gate insulating layer of the gate electrodes is very thin, electrons are tunneled through the gate insulating layer in the thin film transistor. This causes the drift of the threshold voltage of the transistor, so that the switch state cannot be switched and the circuit failure is caused. The conventional gate oxide insulating dielectric material (such as SiO2, SiNx) cannot satisfy the needs for the high package density development of the current TFT-LCD device.

Figure 3:
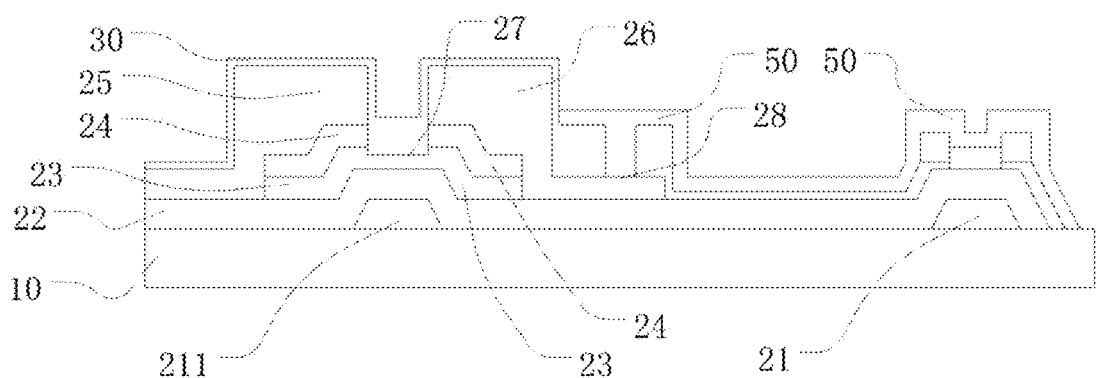
FIG. 3 is another schematic view showing the active array substrate according to the embodiment of this disclosure.
Figure 4:
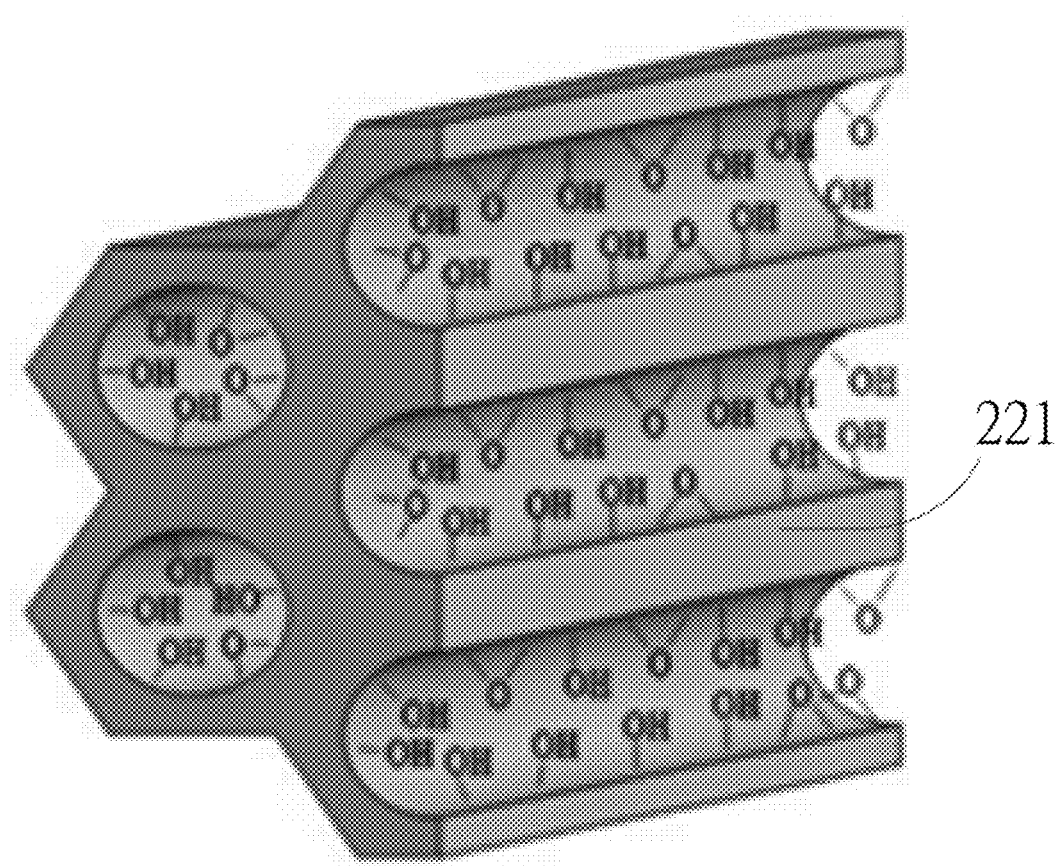
FIG. 4 is a schematic view showing nanometer porous silicon according to the embodiment of this disclosure.
Figure 5:
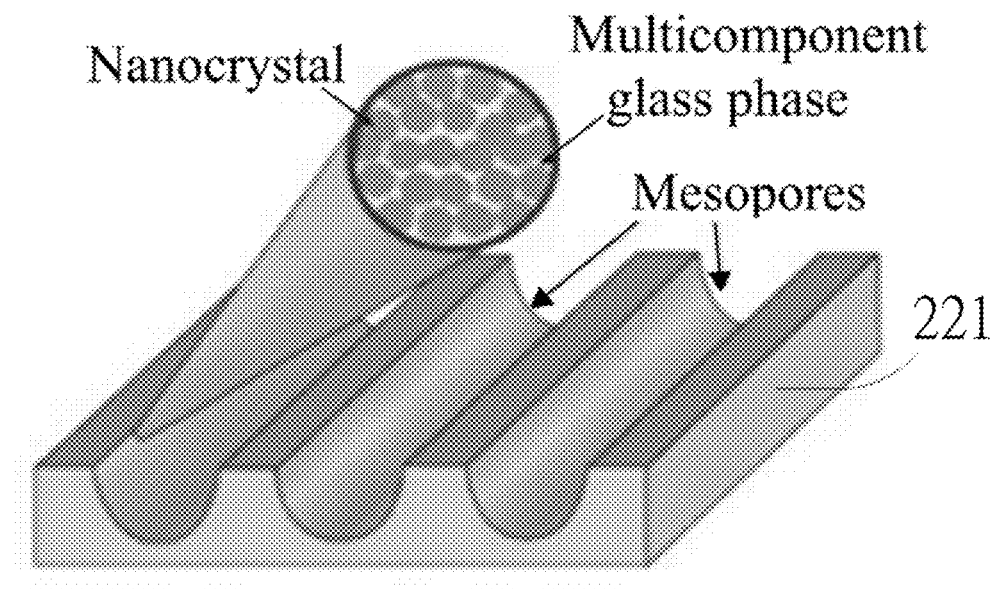
FIG. 5 is a schematic view showing nanometer porous silicon and germanium nanometer particles according to the embodiment of this disclosure.

As shown in FIGS. 3, 4 and 5, the display panel in FIGS. 3, 4 and 5 includes: a substrate 10; a first layer of wires 21 disposed on the substrate 10; a gate insulating layer 22 disposed on the first layer of wires 21. A dielectric constant of the gate insulating layer 22 is greater than dielectric constants of a silicon oxide layer and a silicon nitride layer. The gate insulating layer 22 includes a combination, and the combination includes a first composition and a second composition.

The dielectric constant of the gate insulating layer 22 disposed on first layer of wires 21 is greater than the dielectric constants of the silicon oxide layer and the silicon nitride layer, and the device storage charge capacity is increased. The gate insulating layer 22 includes the combination, and the combination includes the first composition and the second composition. A dielectric constant of the first composition is smaller than the dielectric constants of the silicon oxide layer and the silicon nitride layer, and a dielectric constant of the second composition is greater than the dielectric constants of the silicon oxide layer and the silicon nitride layer. Adjusting the ratio of the first composition to the second composition makes the dielectric constant of the gate insulating layer 22 be adjustable.

Optionally, the first composition includes nanometer porous silicon. The nanometer porous silicon can be made very thin, can reduce the thickness of the insulating dielectric layer, and can satisfy the requirement that the sizes of the integrated circuit, the wafer, and the TFT-LCD are continuously reduced. The nanometer porous silicon itself is hydrophobic.

Optionally, the second composition includes germanium nanometer particles. The dielectric constant of germanium is 16, and the dielectric constant of the gate insulating layer 22 is increased by adjusting the ratio of germanium. Of course, other metals with high dielectric constants and other materials may also be used.

Optionally, the first composition includes nanometer porous silicon, and the second composition includes germanium nanometer particles. The nanometer porous silicon can be made very thin, can reduce the thickness of the insulating dielectric layer, and can satisfy the requirement that the sizes of the integrated circuit, the wafer, and the TFT-LCD are continuously reduced. The nanometer porous silicon itself is hydrophobic. The dielectric constant of the germanium is 16. The nanometer porous silicon itself has many silicon pores, and the germanium nanometer particles can be deposited into the silicon pores without increasing the thickness of the nanometer porous silicon. Adjusting the loading of the germanium (Ge) nanometer particles makes the dielectric constant be controllable and adjustable.

The gate insulating layer 22 includes nanometer porous silicon, the nanometer porous silicon includes multiple hollow columnar sub-elements 221 connected together, the sub-element 221 has a hexagonal section, a circular through hole is formed at a middle of the sub-element 221, the circular through hole of the sub-element 221 is provided with multiple silicon pores, and the germanium nanometer particles are disposed in the silicon pores. A sub-component 42 of the porous silicon has a hexagonal section to facilitate the stitched arrangement of the multiple sub-components 42, the multiple germanium nanometer particles are disposed in the silicon pores, and the thickness of the porous silicon is not affected.

The amorphous silicon layer 23 corresponding to the gate conductor segment 211 is disposed on the gate insulating layer 22. The Ohmic contact layer 24 corresponding to the amorphous silicon layer 23 is disposed on the amorphous silicon layer 23. The source electrode 25 and the drain electrode 26 separated from each other are disposed on the Ohmic contact layer 24. The trench 27 is formed between the source electrode 25 and the drain electrode 26. The trench 27 penetrates through the Ohmic contact layer 24. The bottom portion of the trench 27 is the amorphous silicon layer 23. The widths of the source electrode 25 and the drain electrode 26 are greater than the width of the amorphous silicon layer 23. The second insulation 30 is disposed on the source electrode 25 and the drain electrode 26. The pixel electrode layer 50 is disposed on the second insulation 30. The second insulation 30 is formed with a through hole 28 corresponding to the drain electrode 26, and the pixel electrode layer 50 is connected to the drain electrode 26 through the through hole 28. One partial side of the source electrode 25 exceeding the amorphous silicon layer 23 is directly connected to the gate insulating layer 22, and the other side of the source electrode 25 is directly connected to the protection layer 40 having the low dielectric constant. The portion of the gate insulating layer 22 corresponding to the through hole 28 is connected to the drain electrode 26. The thin film transistor (TFT) formed using five masks has the better performance.

As shown in FIGS. 2, 4 and 5, the display panel in FIGS. 2, 4 and 5 includes: a substrate 10; a first layer of wires 21 disposed on the substrate 10; a gate insulating layer 22 disposed on the first layer of wires 21. A dielectric constant of the gate insulating layer 22 is greater than dielectric constants of a silicon oxide layer and a silicon nitride layer. The gate insulating layer 22 includes a combination, and the combination includes a first composition and a second composition.

The dielectric constant of the gate insulating layer 22 disposed on first layer of wires 21 is greater than the dielectric constants of the silicon oxide layer and the silicon nitride layer, and the device storage charge capacity is increased. The gate insulating layer 22 includes the combination, and the combination includes the first composition and the second composition. A dielectric constant of the first composition is smaller than the dielectric constants of the silicon oxide layer and the silicon nitride layer, and a dielectric constant of the second composition is greater than the dielectric constants of the silicon oxide layer and the silicon nitride layer. Adjusting the ratio of the first composition to the second composition makes the dielectric constant of the gate insulating layer 22 be adjustable.

Optionally, the first composition includes nanometer porous silicon. The nanometer porous silicon can be made very thin, can reduce the thickness of the insulating dielectric layer, and can satisfy the requirement that the sizes of the integrated circuit, the wafer, and the TFT-LCD are continuously reduced. The nanometer porous silicon itself is hydrophobic.

Optionally, the second composition includes germanium nanometer particles. The dielectric constant of germanium is 16, and the dielectric constant of the gate insulating layer 22 is increased by adjusting the ratio of germanium. Of course, other metals with high dielectric constants and other materials may also be used.

Optionally, the first composition includes nanometer porous silicon, and the second composition includes germanium nanometer particles. The nanometer porous silicon can be made very thin, can reduce the thickness of the insulating dielectric layer, and can satisfy the requirement that the sizes of the integrated circuit, the wafer, and the TFT-LCD are continuously reduced. The nanometer porous silicon itself is hydrophobic. The dielectric constant of the germanium is 16. The nanometer porous silicon itself has many silicon pores, and the germanium nanometer particles can be deposited into the silicon pores without increasing the thickness of the nanometer porous silicon. Adjusting the loading of the germanium (Ge) nanometer particles makes the dielectric constant be controllable and adjustable.

The gate insulating layer 22 includes nanometer porous silicon, the nanometer porous silicon includes multiple hollow columnar sub-elements 221 connected together, the sub-element 221 has a hexagonal section, a circular through hole is formed at a middle of the sub-element 221, the circular through hole of the sub-element 221 is provided with multiple silicon pores, and the germanium nanometer particles are disposed in the silicon pores. A sub-component 42 of the porous silicon has a hexagonal section to facilitate the stitched arrangement of the multiple sub-components 42, the multiple germanium nanometer particles are disposed in the silicon pores, and the thickness of the porous silicon is not affected.

The amorphous silicon layer 23 corresponding to the gate conductor segment 211 is disposed on the gate insulating layer 22. The Ohmic contact layer 24 corresponding to the amorphous silicon layer 23 is disposed on the amorphous silicon layer 23. The source electrode 25 and the drain electrode 26 separated from each other are disposed on the Ohmic contact layer 24. The trench 27 is formed between the source electrode 25 and the drain electrode 26. The trench 27 penetrates through the Ohmic contact layer 24. The bottom portion of the trench 27 is the amorphous silicon layer 23. The widths of the source electrode 25 and the drain electrode 26 are equal to the width of the Ohmic contact layer 24 in contact therewith. The second insulation 30 is disposed on the source electrode 25 and the drain electrode 26. The pixel electrode layer 50 is disposed on the second insulation 30. The second insulation 30 is formed with a through hole 28 corresponding to the drain electrode 26, and the pixel electrode layer 50 is connected to the drain electrode 26 through the through hole 28. The protection layer 40 having the low dielectric constant on the outer side of the source electrode 25 is directly connected to the gate insulating layer 22. The amorphous silicon layer 23, the Ohmic contact layer 24 and the drain electrode 26 are disposed above the gate insulating layer 22 corresponding to the through hole 28 in order. The use of four masks can obtain the better performance of the thin film transistor (TFT), and saves one mask.

Figure 6:
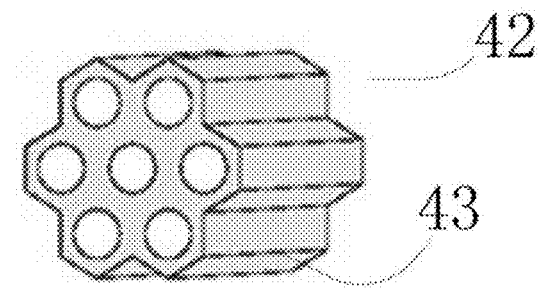
FIG. 6 is a schematic view showing mesopore silicon oxide according to the embodiment of this disclosure.

As shown in FIGS. 2, 3 and 6, the display panel in FIGS. 2, 3 and 6 includes: a substrate 10; a first layer of wires 21 disposed on the substrate 10; a gate insulating layer 22 disposed on the first layer of wires 21. A dielectric constant of the gate insulating layer 22 is greater than dielectric constants of a silicon oxide layer and a silicon nitride layer. The gate insulating layer 22 includes a combination, and the combination includes a first composition and a second composition.

A relative dielectric constant of the second insulation 30 is smaller than relative dielectric constants of silicon oxide and silicon nitride. The use of the protection layer having the low dielectric constant can enhance the device performance of the thin film transistor (TFT), and improve the signal crosstalk problem and the RC circuit delay problem.

Optionally, the amorphous silicon layer 23 corresponding to the gate conductor segment 211 is disposed on the gate insulating layer 22. The Ohmic contact layer 24 corresponding to the amorphous silicon layer 23 is disposed on the amorphous silicon layer 23. The source electrode 25 and the drain electrode 26 separated from each other are disposed on the Ohmic contact layer 24. The trench 27 is formed between the source electrode 25 and the drain electrode 26. The trench 27 penetrates through the Ohmic contact layer 24. The bottom portion of the trench 27 is the amorphous silicon layer 23. The widths of the source electrode 25 and the drain electrode 26 are greater than the width of the amorphous silicon layer 23. The second insulation 30 is disposed on the source electrode 25 and the drain electrode 26. The pixel electrode layer 50 is disposed on the second insulation 30. The second insulation 30 is formed with a through hole 28 corresponding to the drain electrode 26, and the pixel electrode layer 50 is connected to the drain electrode 26 through the through hole 28. One partial side of the source electrode 25 exceeding the amorphous silicon layer 23 is directly connected to the gate insulating layer 22, and the other side of the source electrode 25 is directly connected to the protection layer 30 having the low dielectric constant. The portion of the gate insulating layer 22 corresponding to the through hole 28 is connected to the drain electrode 26.

The amorphous silicon layer 23 corresponding to the gate conductor segment 211 is disposed on the gate insulating layer 22. The Ohmic contact layer 24 corresponding to the amorphous silicon layer 23 is disposed on the amorphous silicon layer 23. The source electrode 25 and the drain electrode 26 separated from each other are disposed on the Ohmic contact layer 24. The trench 27 is formed between the source electrode 25 and the drain electrode 26. The trench 27 penetrates through the Ohmic contact layer 24. The bottom portion of the trench 27 is the amorphous silicon layer 23. The widths of the source electrode 25 and the drain electrode 26 are equal to the width of the Ohmic contact layer 24 in contact therewith. The second insulation 30 is disposed on the source electrode 25 and the drain electrode 26. The pixel electrode layer 50 is disposed on the second insulation 30. The second insulation 30 is formed with a through hole 28 corresponding to the drain electrode 26, and the pixel electrode layer 50 is connected to the drain electrode 26 through the through hole 28. The protection layer having the low dielectric constant on the outer side of the source electrode 25 is directly connected to the gate insulating layer 22. The amorphous silicon layer 23, the Ohmic contact layer 24 and the drain electrode 26 are disposed above the gate insulating layer 22 corresponding to the through hole 28 in order.

The protection layer having the low dielectric constant includes mesopore silicon oxide. A relative dielectric constant εr of the mesopore silicon oxide ranges from 1.4 to 2.4, the protection layer having the low dielectric constant uses the mesopore silicon oxide to replace the protection layer material SiNx (the relative dielectric constant εr=7 to 8) in the 5-mask and 4-mask process TFT device, εr of the mesopore silicon oxide is lower than εr of the general silicon oxide (the relative dielectric constant εr=3.9 to 4.1), the TFT device performance can be enhanced, the signal crosstalk problem and the RC circuit delay problem can be improved, and the thickness of the protection layer having the low dielectric constant is reduced. Of course, the protection layer having the low dielectric constant can also use other materials having low dielectric constants, such as the nanometer porous silicon and the like.

The mesopore silicon oxide includes multiple sub-units 43, the sub-unit 43 includes sub-components 42 arranged in three rows, the middle row of the sub-unit 43 includes three sub-components 42 disposed side by side, the first row and the third row of sub-units 43 include two sub-components 42 disposed side by side, the two sub-components 42 of the first row and the third row are respectively disposed between arbitrary two sub-components 42 of the middle one row of three sub-components 42, the sub-component 42 has a hexagonal section, and the circular through hole is formed at a middle of the sub-component 42. The sub-unit 43 has the sub-components 42 arranged in a regular order, and has a higher specific surface area, the better thermal stability and the hydrothermal stability. The sizes of the through holes of sub-components 42 are uniform, the sub-component 42 has a hexagonal section to facilitate the stitched arrangement of the multiple sub-components 42.

In the above-mentioned embodiment, the amorphous silicon layer uses an a-Si material. Of course, other semiconductor layer materials may also be used.

Figure 7:
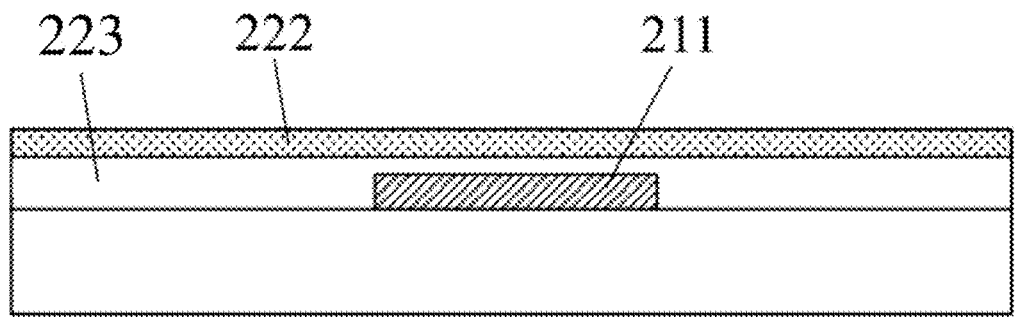
FIG. 7 is a schematic view showing a gate insulating layer according to an embodiment of this disclosure.

As shown in FIG. 7, in some embodiments, the gate insulating layer 22 may include a first insulating layer 223 and a second insulating layer 222 stacked together. The first insulating layer 223 cannot have nanometer particles, such as the nitro silicon compound (SiNx) insulating layer, and the nanometer porous silicon and the nanometer particles are formed in the second insulating layer 222. The dielectric constant of the gate insulating layer 22 can be further adjusted by adjusting the materials of the first insulating layer 223 and the second insulating layer 222.

In some embodiments, the nanometer particles may include two or more than two types of nanometer particles with different dielectric constants. The dielectric constant of the gate insulating layer 22 can be further adjusted by adjusting the nanometer particles having different dielectric constants.

In the above embodiments, the material of the substrate can be optionally glass or plastics.

In the above embodiment, the display panel comprises the liquid crystal panel, OLED panel, curved panel, plasma panel, and the likes. Taking a liquid crystal panel as an example, the liquid crystal panel comprises a TFT substrate and a CF substrate, which are disposed opposite to each other. The liquid crystal molecules and photo spacers are disposed between the TFT substrate and the CF substrate. The TFT substrate is configured with an active switch, which can be a thin-film transistor, and the CF substrate is configured with a color filter layer.

In the above embodiment, the CF substrate can also be configured with the TFT array, and the color filter layer and the TFT array are disposed on the same substrate. Alternatively, the TFT may also comprise the color filter layer.

In the above embodiment, the display panel of the disclosure can be a curved panel.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of manufacturing an active array substrate, comprising:
providing a substrate;
forming gate electrodes on the substrate;
forming a gate insulating layer, a semiconductor layer and an Ohmic contact layer on the substrate and the gate electrodes in order;
forming source electrodes and drain electrodes on the Ohmic contact layer;
forming a protection layer on the source electrodes and the drain electrodes; and
forming a pixel electrode layer on the protection layer, wherein the pixel electrode layer is electrically connected to the drain electrodes;
wherein the gate insulating layer comprises nanometer porous silicon and nanometer particles, and a dielectric constant of the nanometer particle is greater than a dielectric constant of the nanometer porous silicon;
wherein the gate insulating layer comprises a first insulating layer and a second insulating layer stacked together, and the nanometer porous silicon and the nanometer particles are formed in the second insulating layer.

2. The method according to claim 1, wherein the nanometer particles comprise two or more than two types of nanometer particles with different dielectric constants.

3. The method according to claim 1, wherein the gate insulating layer comprises a combination, the combination comprises a first composition and a second composition, a dielectric constant of the first composition is smaller than dielectric constants of a silicon oxide layer and a silicon nitride layer, and a dielectric constant of the second composition is greater than the dielectric constants of the silicon oxide layer and the silicon nitride layer.

4. The method according to claim 1, wherein the protection layer is formed on the source electrodes and the drain electrodes, the pixel electrode layer is formed on the protection layer, the protection layer has a through hole corresponding to the drain electrode, and the pixel electrode layer is connected to the drain electrode through the through hole.

5. The method according to claim 4, wherein a relative dielectric constant of the protection layer is smaller than a relative dielectric constant of the nanometer porous silicon.

6. A method of manufacturing an active array substrate, comprising:
providing a substrate;
forming gate electrodes on the substrate;
forming a gate insulating layer, a semiconductor layer and an Ohmic contact layer on the transparent substrate and the gate electrodes in order;
forming source electrodes and drain electrodes on the Ohmic contact layer;
forming a protection layer on the source electrodes and the drain electrodes; and
forming a pixel electrode layer on the protection layer, wherein the pixel electrode layer is electrically connected to the drain electrode;
wherein the gate insulating layer comprises nanometer porous silicon and nanometer particles, and a dielectric constant of the nanometer particle is greater than a dielectric constant of the nanometer porous silicon;
wherein the protection layer is formed on the source electrodes and the drain electrodes, the pixel electrode layer is formed on the protection layer, the protection layer has a through hole corresponding to the drain electrode, and the pixel electrode layer is connected to the drain electrode through the through hole, and a relative dielectric constant of the protection layer is smaller than a relative dielectric constant of the nanometer porous silicon;
wherein the gate insulating layer comprises a first insulating layer and a second insulating layer stacked together, and the nanometer porous silicon and the nanometer particles are formed in the second insulating layer; and
wherein the nanometer particles comprise two or more than two types of nanometer particles with different dielectric constants.

7. An active array substrate, comprising:
a substrate;
a first layer of wires being disposed on the substrate and comprising transparent materials and gate electrodes, wherein a gate insulating layer, a semiconductor layer and an Ohmic contact layer are disposed on the first layer of wires in order;
source electrodes and drain electrodes disposed on the Ohmic contact layer;
a protection layer disposed on the source electrodes and the drain electrodes; and
a pixel electrode layer, which is disposed on the protection layer, and is electrically connected to the drain electrode;
wherein the gate insulating layer comprises nanometer porous silicon and nanometer particles, and a dielectric constant of the nanometer particle is greater than a dielectric constant of the nanometer porous silicon;
wherein the gate insulating layer comprises a first insulating layer and a second insulating layer stacked together, and the nanometer porous silicon and the nanometer particles are formed in the second insulating layer.

8. The active array substrate according to claim 7, wherein the nanometer particles comprise two or more than two types of nanometer particles with different dielectric constants.

9. The active array substrate according to claim 7, wherein the gate insulating layer comprises a combination, the combination comprises a first composition and a second composition, a dielectric constant of the first composition is smaller than dielectric constants of a silicon oxide layer and a silicon nitride layer, and a dielectric constant of the second composition is greater than the dielectric constants of the silicon oxide layer and the silicon nitride layer.

10. The active array substrate according to claim 7, wherein the protection layer is formed on the source electrodes and the drain electrodes, the pixel electrode layer is formed on the protection layer, the protection layer has a through hole corresponding to the drain electrode, and the pixel electrode layer is connected to the drain electrode through the through hole.

11. The active array substrate according to claim 10, wherein a relative dielectric constant of the protection layer is smaller than a relative dielectric constant of the nanometer porous silicon.

\* \* \* \* \*